(12) United States Patent
Oh et al.

(10) Patent No.: US 8,933,517 B2
(45) Date of Patent: *Jan. 13, 2015

(54) SEMICONDUCTOR DEVICE COMPRISING A DUMMY WELL

(71) Applicant: Samsung Electronics Co., Ltd., Suwon-si (KR)

(72) Inventors: Dong-yean Oh, Seoul (KR); Woon-kyung Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/091,592

(22) Filed: Nov. 27, 2013

(65) Prior Publication Data

US 2014/0084376 A1 Mar. 27, 2014

Related U.S. Application Data

(60) Continuation of application No. 13/542,777, filed on Jul. 6, 2012, now Pat. No. 8,609,496, which is a division of application No. 12/631,109, filed on Dec. 4, 2009, now Pat. No. 8,237,230.

(30) Foreign Application Priority Data

Dec. 4, 2008 (KR) .................. 10-2008-0122600

(51) Int. Cl.
*H01L 29/76* (2006.01)
*H01L 27/088* (2006.01)
*H01L 21/8234* (2006.01)

(52) U.S. Cl.
CPC ...... *H01L 27/088* (2013.01); *H01L 21/823462* (2013.01); *H01L 21/823493* (2013.01)
USPC ...... 257/392; 257/368; 257/371; 257/E27.061

(58) Field of Classification Search
USPC .................. 257/392, 368–371, E27.061
See application file for complete search history.

(56) References Cited

U.S. PATENT DOCUMENTS

| | | | |
|---|---|---|---|
| 6,900,097 | B2 | 5/2005 | Chen et al. |
| 7,041,562 | B2 | 5/2006 | Lim et al. |
| 8,237,230 | B2 * | 8/2012 | Oh et al. ............... 257/392 |
| 2003/0119285 | A1 | 6/2003 | Igarashi |
| 2006/0263994 | A1 | 11/2006 | Forbes |
| 2007/0037368 | A1 | 2/2007 | Kim |

FOREIGN PATENT DOCUMENTS

| | | |
|---|---|---|
| JP | 11-186405 | 7/1999 |
| KR | 100265774 | 6/2000 |
| KR | 1020070013023 | 1/2007 |

* cited by examiner

*Primary Examiner* — Thanh T Nguyen
(74) *Attorney, Agent, or Firm* — Myers Bigel Sibley & Sajovec, P.A.

(57) ABSTRACT

Provided are a semiconductor device and a method of fabricating the semiconductor device. The semiconductor device may include first transistors that include a first gate insulating layer having a first thickness and second transistors include a second gate insulating layer having a second thickness less than the first thickness. At least one of the transistors formed on the first or second gate insulating layers may be directly over a dummy well.

12 Claims, 6 Drawing Sheets

SEMICONDUCTOR DEVICE COMPRISING A DUMMY WELL

CROSS-REFERENCE TO RELATED APPLICATIONS

This application is a continuation of U.S. patent application Ser. No. 13/542,777, filed Jul. 6, 2012, which is a divisional of U.S. patent application Ser. No. 12/631,109, filed Dec. 4, 2009 in the United States Patent and Trademark Office, now U.S. Pat. No. 8,237,230, and claims priority to Korean Patent Application No. 10-2008-0122600, filed on Dec. 4, 2008, in the Korean Intellectual Property Office, the disclosures of which are incorporated herein in their entireties by reference.

BACKGROUND

The inventive concept relates to a semiconductor device and a method of fabricating the same, and more particularly, to a semiconductor device and a method of fabricating the same using a much simpler process at low cost.

Since several types of semiconductor elements are integrated into a semiconductor device, operating voltages respectively applied to the semiconductor elements can be different from one another. Thus, thicknesses of gate insulating layers respectively used for the semiconductor elements can be different from one another.

Depths, conductive types, and impurity densities of wells respectively formed under the semiconductor elements are diverse. Thus, if the semiconductor elements are separately fabricated, steps of the whole process may be increased.

SUMMARY

According to an aspect of the inventive concept, the semiconductor device can include first transistors that include a first gate insulating layer having a first thickness and second transistors that include a second gate insulating layer having a second thickness less than the first thickness. At least one of the transistors formed on the first or second gate insulating layers is directly over a dummy well.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
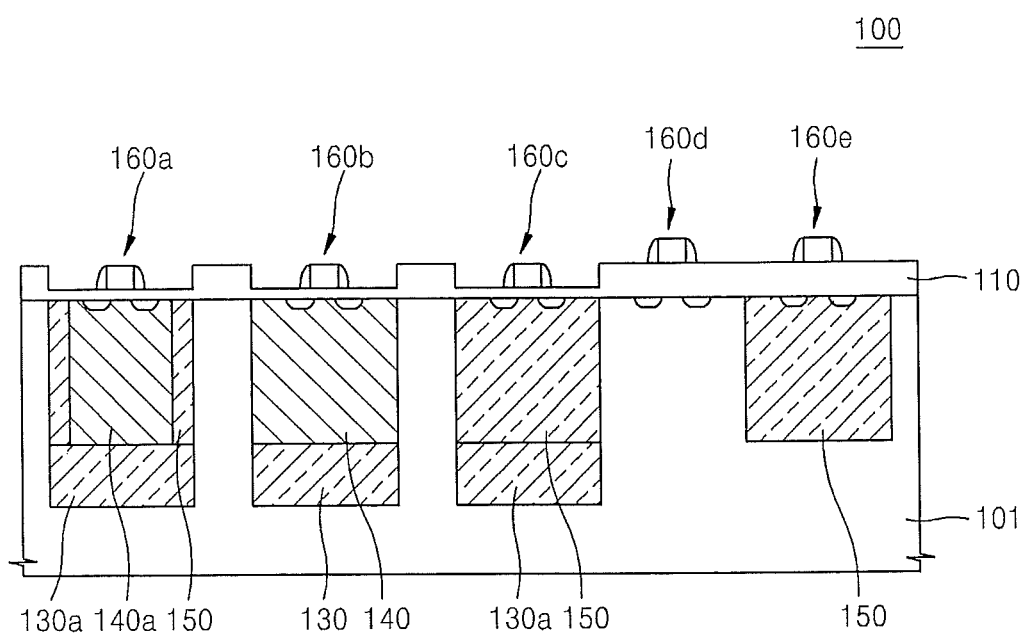
FIG. 1 is a cross-sectional view of a semiconductor device according to an embodiment of the inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present inventive concept.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present inventive concept are described herein with reference to cross section and perspective illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a cross-sectional view of a semiconductor device 100 according to an embodiment of the inventive concept. Referring to FIG. 1, the semiconductor device 100 includes first transistors 160d and 160e including a first gate insulating layer having a first thickness and second transistors 160a, 160b, and 160c including a second gate insulting layer having a second thickness. The second thickness may be thinner than the first thickness. In more detail, the first thickness may be from about 200 Å to about 600 Å, and the second thickness may be from about 10 Å to about 150 Å.

The first gate insulating layer may have a different thickness from the second gate insulating layer, and a lower surface of the first gate insulating layer may be substantially on the same plane as a lower surface of the second gate insulating layer. Here, "being substantially on the same plane" includes a meaning that the lower surface of the first gate insulating layer is on the completely same plane as that of the second gate insulating layer (i.e., co-planar) and a meaning that the lower surfaces of the first and second gate insulating layers are formed under the same conditions and thus are not distinguished from one another. However, a step of forming the first gate insulating layer may be different from a step of forming the second gate insulating layer.

If the first and second gate insulating layers are simultaneously formed as mentioned above, the lower surface of the first gate insulating layer may be substantially on the same plane as that of the second gate insulating layer, and the first gate insulating layer may be thicker than the second gate insulating layer. Thus, a plane including an upper surface of the first gate insulating layer may be higher than a plane including an upper surface of the second gate insulating layer.

As shown in FIG. 1, the semiconductor device 100 includes a first conductive type of deep wells 130a and 150 and/or a first conductive type of dummy well 130 which are formed under at least one of the second transistors 160a, 160b, and 160c. The first conductive type of deep wells 130a and 150 refer to a region into which regions 130a and regions 150 are combined. The first conductive type of deep wells 130a and 150 are on the assumption that other wells shallower than the first conductive type of deep wells 130a and 150 exist, and they have relatively deeper depths than the other wells. The first conductive type of dummy well 130 refers to a first conductive type of region which is buried underneath a second conductive type of well 140 and may not contribute to an operation of the semiconductor device 100. In other words, the first conductive type of dummy well 130 is not necessary for operating the semiconductor device 100 but may be a region which is formed when the semiconductor device 100 is fabricated.

A semiconductor substrate 101 may be a substrate which is doped with a specific conductive type of ions, and the deep wells 130a and 150 and/or the dummy well 130 may have opposite conductive types to a conductive type of the semiconductor substrate 101.

The second conductive type of well 140 is formed on the dummy well 130. A depth of the second conductive type of well 140 may be shallower than a depth of each of the deep wells 130a and 150.

The semiconductor device 100 may further include a first conductive type of well 150 which is formed under at least one of the first transistors 160d and 160e. A lower surface of the well 150 may be higher than lower surfaces of the deep wells 130a and 150 and the dummy well 130.

The semiconductor device 100 may further include a first conductive type of deep wells 130a and 150 which are formed under at least one of the second transistors 160a, 160b, and 160c and a second conductive type of pocket well 140a which is formed inside the deep wells 130a and 150.

A method of fabricating a semiconductor device according to an embodiment of the inventive concept will now be described.

FIGS. 2A through 2H are cross-sectional views illustrating a method of fabricating a semiconductor device according to an embodiment of the inventive concept.

Figure 2A:
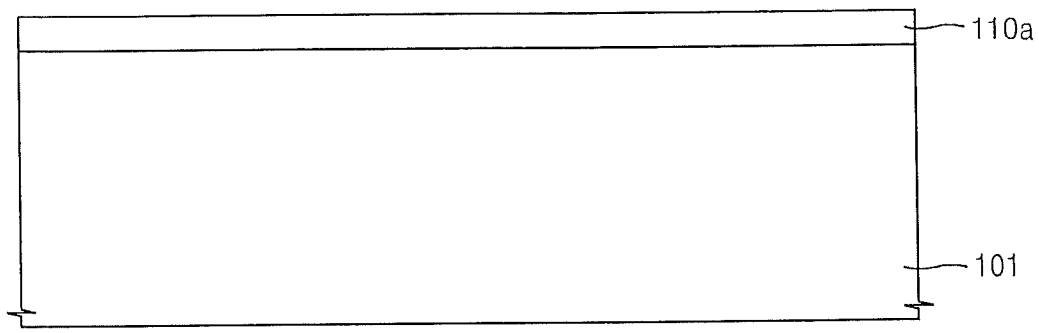
FIGS. 2A through 2H are cross-sectional views illustrating a method of fabricating a semiconductor device according to an embodiment of the inventive concept.

Referring to FIG. 2A, an insulating material layer 110a is formed on a semiconductor substrate 101 to a first thickness. The semiconductor substrate 101 may be a silicon substrate or a substrate which is doped with a specific conductive type of impurities. For example, the semiconductor substrate 101 may be a p-substrate which is doped with p-type impurities at a predetermined density.

A surface of the semiconductor substrate 101 may be thermally oxidized to form the insulating material layer 110a. Alternatively, an insulating material may be deposited on the semiconductor substrate 101 using a method such as chemical vapor deposition (CVD) to form the insulating material layer 110a. However, the method of forming the insulating material layer 110a is not limited thereto. The insulating material layer 110a may be a silicon oxide layer. However, the material of the insulating material layer 110a is not limited thereto. The first thickness of the insulating material layer 110a may be from 200 Å to 600 Å.

Figure 2B:
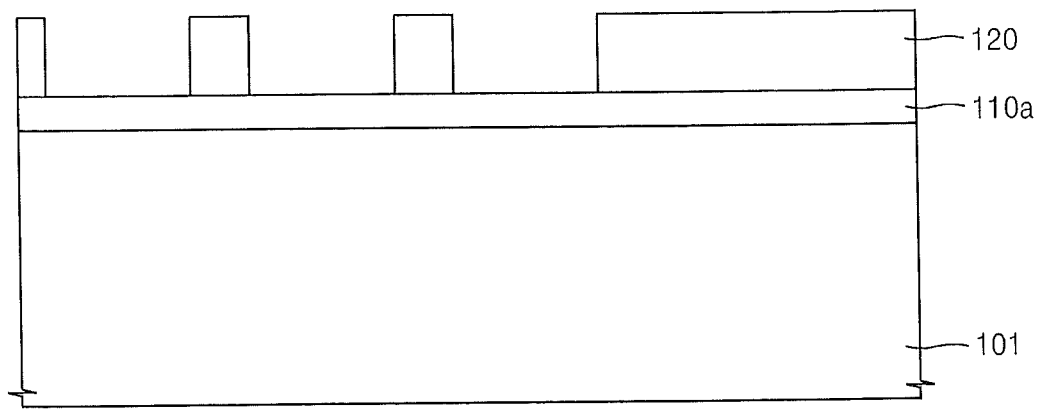

Referring to FIG. 2B, to form a second gate insulating layer having the second thickness thinner than the first thickness, an etching mask 120 is formed to expose a region in which the second gate insulating layer is to be formed. The etching mask 120 may be formed using a photolithography process (i.e., a first photolithography process).

Figure 2C:
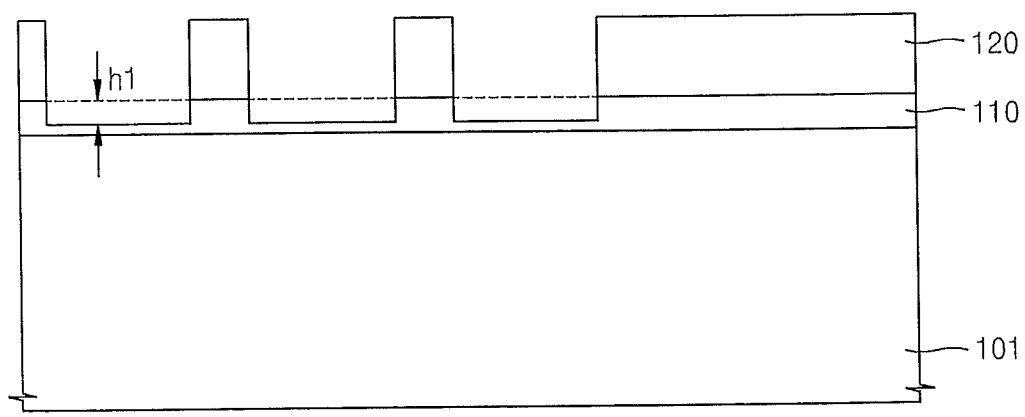

Referring to FIG. 2C, a portion of the insulating material layer 110a is etched in a vertical direction through openings in the etching mask 120. In other words, the portion of the insulating material layer 110a corresponding to a depth "h1" is etched through openings in the etching mask 120. Thus, a portion of the insulating material layer 110a exposed through the etching mask 120 has the second thickness. The insulating material layer 110a may be etched back or may be appropriately wet etched to achieve etching of the portion of the insulating material layer 110a. The second thickness may be from 10 Å to 150 Å.

Figure 2D:
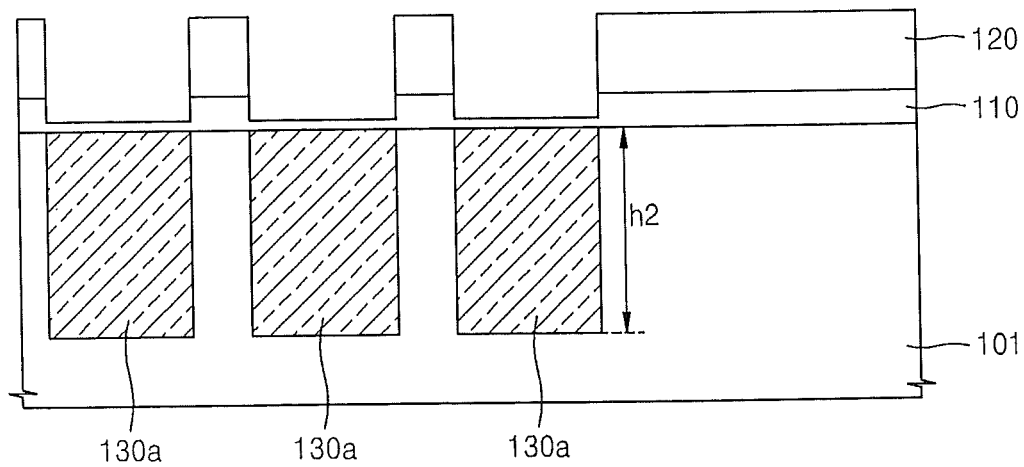

Referring to FIG. 2D, a first conductive type of ions may be implanted to a first depth "h2" through openings in the etching mask 120 to form one or more first conductive type of wells 130a/130. The first conductive type of the wells 130a may be opposite to a conductive type of the semiconductor substrate 101. The first conductive type of ions may be implanted at a dose from $2\times10^{12}$ ions/cm$^2$ to $5\times10^{12}$ ions/cm$^2$ at energy from 80 KeV to 4000 KeV to form the first conductive type of wells 130a. The first depth "h2" may be from 1000 nm to 2000 nm.

Figure 2E:
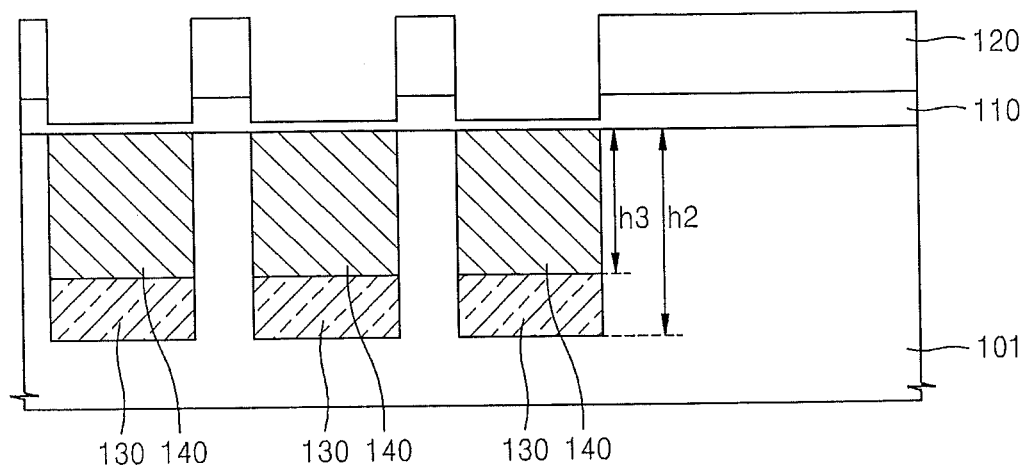

Referring to FIG. 2E, a second conductive type of ions may be implanted to a second depth "h3" through the etching mask 120 to form a second conductive type of wells 140, wherein the second conductive type is opposite to the first conductive type, and the second depth "h3" is shallower than the first depth "h2." The second conductive type of the wells 140 may be equal to the conductive type of the semiconductor substrate 101. The second conductive type of ions may be implanted at a dose from $2\times10^{12}$ ions/cm$^2$ to $5\times10^{13}$ ions/cm$^2$ at energy from 20 KeV to 900 KeV to form the second conductive type of wells 140. A density of the conductive type of ions in the second conductive type of wells 140 may be higher than that of the first conductive type of ions therein to form the second conductive type of wells 140. The dose of the second conductive type of ions may be appropriately selected within the above-mentioned range in consideration of this. The second depth "h3" may be from 500 nm to 1200 nm.

The first conductive type of wells 130a are formed to the first depth "h2," and the second conductive type of wells 140 are formed to the second depth "h3" shallower than the first depth "h2" to form a first conductive type of dummy wells 130 underneath the second conductive type of wells 140. However, some of the first conductive type of dummy wells 130 may contribute to an electric conduction depending on whether the dummy wells 130 are additionally doped with ions, as described further herein. Here, wells which do not contribute to the electric conduction are referred to as floating wells.

Figure 2F:
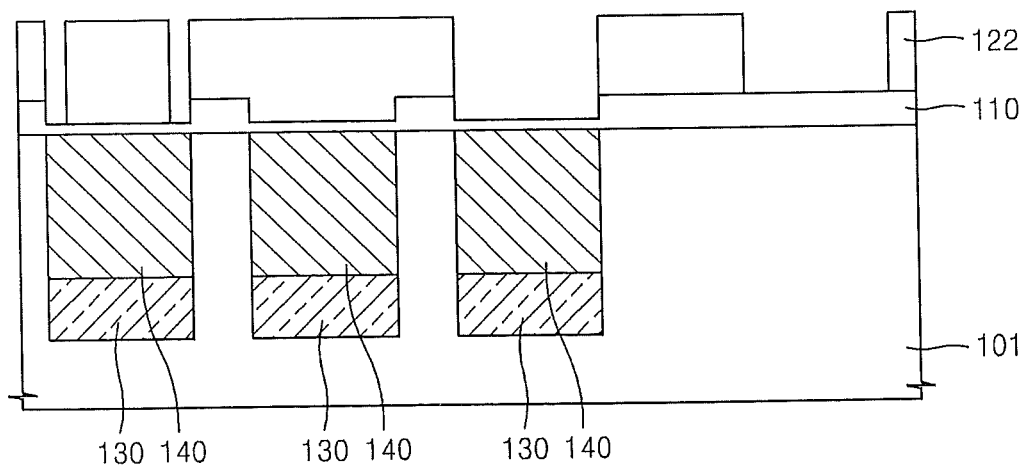

Referring to FIG. 2F, the etching mask 120 is removed, and an ion implantation mask 122 is formed to expose a region in which a first conductive type of well is to be formed. The etching mask 120 may be removed using an appropriate method known to those of ordinary skill in the art depending on its material. The ion implantation mask 122 may be formed using a photolithography process (i.e., a second photolithography process). The region in which the first conductive type of well is to be formed may be appropriately selected depending on whether a device to be formed in the corresponding region is an n-channel metal-oxide semiconductor (NMOS) device or a p-channel metal-oxide semiconductor (PMOS) device.

Figure 2G:
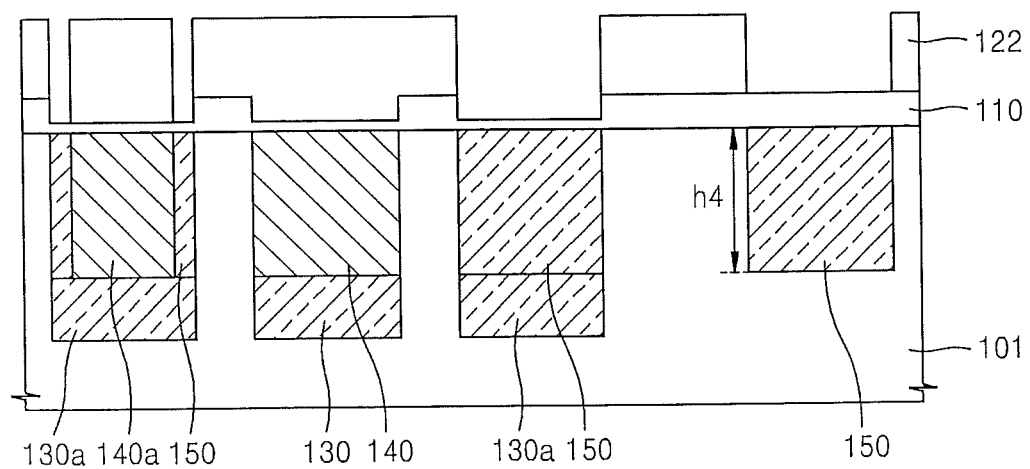

Referring to FIG. 2G, a first conductive type of ions are implanted using the ion implantation mask 122 to form a first conductive type of well 150. A depth of the first conductive type of well 150 is not limited to "h4". For example, if a second conductive type of pocket region 140a is to be formed as shown on the left part of FIG. 2G, energy and a dose of the implanted ions may be adjusted so that the depth "h4" is greater than the second depth "h3." The first conductive type of ions may be implanted at a dose from $2\times10^{12}$ ions/cm$^2$ to $9\times10^{13}$ ions/cm$^2$ at energy from 20 KeV to 900 KeV to form the first conductive type of well 150. If the second conductive type of well 140 is formed in a region exposed through the ion implantation mask 122, the energy and the dose of the first conductive type of implanted ions may be adjusted so that a density of the first conductive type of ions implanted into the region through the ion implantation mask 122 is higher than a density of a second conductive type of ions which have been implanted into the region.

Figure 2H:
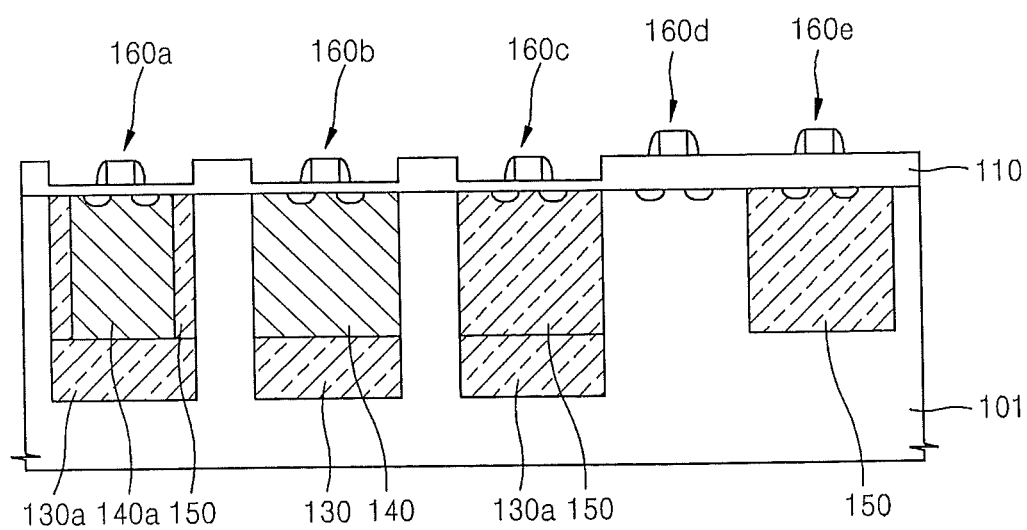

Referring to FIG. 2H, first transistors 160d and 160e and second transistors 160a, 160b, and 160c are formed. Here, the first transistors 160d and 160e include an insulating material layer having the first thickness as a first gate insulating layer, and the second transistors 160a, 160b, and 160c include a second gate insulating layer having the second thickness. If the second transistors 160a, 160b, and 160c include a memory device, the memory device may be a floating gate type device or a charge trap type device. Methods of forming the first transistors 160d and 160e and the second transistors 160a, 160b, and 160c are well known to those of ordinary skill in the art, and thus their detailed descriptions will be omitted herein.

According to the above-described method, steps of fabricating a semiconductor device including various types of wells and gate insulating layers having different thicknesses may be considerably reduced. Thus, the semiconductor device can be fabricated at very low cost. As described above, NMOS and PMOS devices and various types of devices can be realized with respect to the gate insulating layers having different thicknesses by performing photolithography process twice.

Figure 3:
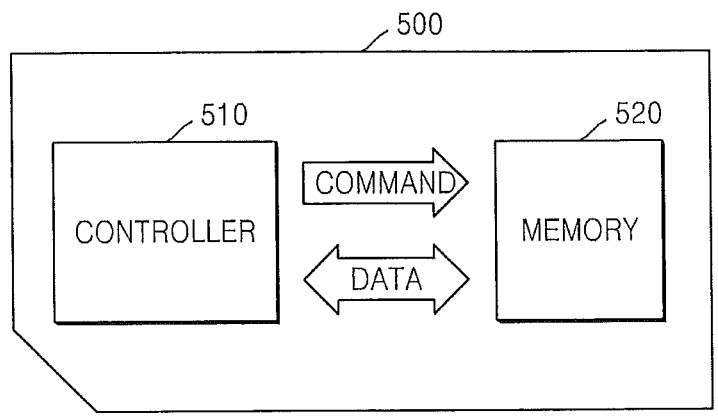
FIG. 3 is a schematic block diagram of a memory card according to an embodiment of the inventive concept.

FIG. 3 is a schematic block diagram of a memory card 5000 according to an embodiment of the inventive concept. Referring to FIG. 3, the memory card 5000 includes a controller 510 and a memory 520 which interchanges an electric signal with each other. For example, when the controller 510 transmits a command to the memory 520, the memory 520 transmits data to the controller 510. The memory 520 may include the semiconductor device 100 according to one of embodiments of the inventive concept. The semiconductor devices 100 according to embodiments of the inventive concept may be arrayed by a "NAND" architecture memory array (not shown) according to a logic gate design as well known in the art. A memory array, in which a plurality of memories is arrayed in a plurality of columns and a plurality of rows, may constitute one or more array banks (not shown), The memory 520 may include a memory array (not shown) or a memory array bank (not shown) as mentioned above. The memory card 5000 may further include a column decoder (not shown), a row decoder (not shown), input/output (I/O) buffers (not shown), and/or a control register (not shown) to drive the memory array bank (not shown). The memory card 5000 may be one of various types of cards, e.g., a memory device such as a memory stick card, a smart media (SM) card, a secure digital (SD) card, a mini SD card, or a multimedia card (MMC).

Figure 4:
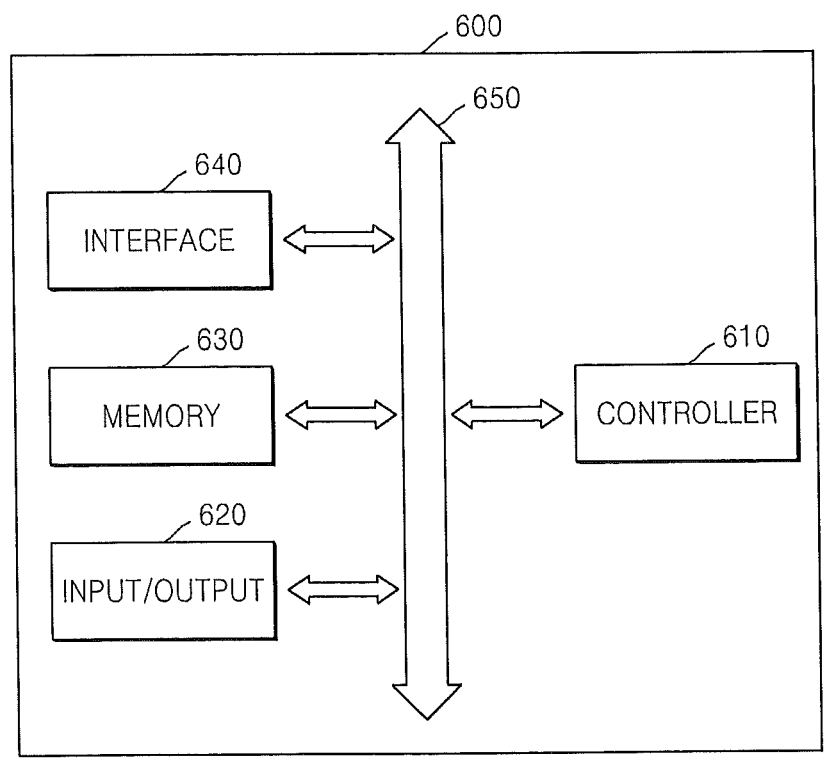
FIG. 4 is a schematic block diagram of a system according to an embodiment of the inventive concept.

FIG. 4 is a schematic block diagram of a system 6000 according to an embodiment of the inventive concept. Referring to FIG. 4, the system 6000 includes a controller 610, an I/O unit 620, a memory 630, and an interface 640. The system 6000 may be a mobile system or a system which transmits or receives information. The mobile system may be a personal digital assistant (PDA), a portable computer, a web tablet, a wireless phone, a mobile phone, a digital music player, or a memory card. The controller 610 executes a program and controls the system 6000. The controller 610 may be a microprocessor, a digital signal processor, a microcontroller, or a device similar to the microprocessor, the digital signal processor, or the microcontroller. The I/O unit 620 inputs data into the system 6000 and/or outputs the data from the system 6000. The system 6000 is connected to an external device, e.g., a personal computer or a network, using the I/O unit 630 to interchange data with the external device. The I/O unit 620 may be a keypad, a keyboard, or a display. The memory 630 stores a code and/or data for an operation of the controller 610 and/or data processed by the controller 610. The memory 630 may include the semiconductor device 100 according to one of embodiments of the inventive concept. The interface 640 may be a data channel through which the system 6000 interchanges data with the external device. The controller 610, the I/O unit 620, the memory 630, and the interface 640 communicate with one another through a bus 650. For example, the system 6000 may be used in a mobile phone, a MP3 player, a navigation system, a portable multimedia player (PMP), a solid state disk (SSD), or household appliances.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
    a plurality of first transistors comprising a first gate insulating layer having a first thickness on a substrate; and
    a plurality of second transistors comprising a second gate insulating layer having a second thickness less than the first thickness on the substrate,
    wherein at least one among the plurality of first transistors and the plurality of second transistors is directly over a dummy well of a first conductivity type, which is underneath a first well of a second conductivity type with a boundary therebetween.

2. The semiconductor device of claim 1, wherein a lower surface of the first gate insulating layer and a lower surface of the second gate insulating layer are substantially co-planar.

3. The semiconductor device of claim 1, wherein an upper surface of the first gate insulating layer is higher than an upper surface of the second gate insulating layer relative to an upper surface of the substrate.

4. The semiconductor device of claim 1, wherein the first thickness is in range of from about 200 Å to about 600 Å, and the second thickness is in range of from about 10 Å to about 150 Å.

5. The semiconductor device of claim 1, further comprising a deep well of the first conductivity type directly under at least one among the plurality of second transistors.

6. The semiconductor device of claim 5, further comprising a second well of the first conductivity type directly under at least one among the plurality of first transistors, wherein a lower surface of the second well is closer than lower surfaces of the deep well and the dummy well to an upper surface of the substrate.

7. The semiconductor device of claim 1, further comprising:
    a deep well of the first conductivity type directly under at least one among the plurality of second transistors; and
    a pocket well of the second conductivity type in the deep well.

8. The semiconductor device of claim 1, wherein a sidewall of the dummy well is aligned to a sidewall of the first well.

9. The semiconductor device of claim 1, wherein an interface between the first and second gate insulating layers is aligned to a sidewall of the first well.

10. The semiconductor device of claim 1, wherein the first well comprises first ions of the first conductivity type.

11. The semiconductor device of claim 10, wherein the first well further comprises second ions of the second conductivity type and a density of the second ions in the first well is greater than a density of the first ions in the first well.

12. The semiconductor device of claim 11, wherein the substrate has the second conductivity type.

* * * * *